United States Patent
Wang et al.

(10) Patent No.: US 9,349,622 B2
(45) Date of Patent: May 24, 2016

(54) METHOD AND APPARATUS FOR PLANARIZATION OF SUBSTRATE COATINGS

(71) Applicant: Taiwan Semiconductor Manufacturing Company, Ltd., Hsin-Chu (TW)

(72) Inventors: Wen-Yun Wang, Taipei (TW);
Cheng-Han Wu, Taichung (TW);
Yu-Chung Su, Hsin-Chu (TW);
Ching-Yu Chang, Yilang County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 263 days.

(21) Appl. No.: 13/800,627

(22) Filed: Mar. 13, 2013

(65) Prior Publication Data

US 2014/0273509 A1   Sep. 18, 2014

Related U.S. Application Data

(60) Provisional application No. 61/778,298, filed on Mar. 12, 2013.

(51) Int. Cl.
| | | |
|---|---|---|
| B05D 3/12 | (2006.01) | |
| H01L 21/67 | (2006.01) | |
| H01L 21/027 | (2006.01) | |
| G03F 7/16 | (2006.01) | |
| H01L 21/3105 | (2006.01) | |
| B05D 1/00 | (2006.01) | |
| H01L 21/02 | (2006.01) | |

(52) U.S. Cl.
CPC ........ *H01L 21/6715* (2013.01); *H01L 21/0273* (2013.01); *H01L 21/31058* (2013.01); *H01L 21/67028* (2013.01); *B05D 1/005* (2013.01); *G03F 7/162* (2013.01); *H01L 21/02282* (2013.01); *H01L 21/31051* (2013.01)

(58) Field of Classification Search
CPC ................ B05D 1/005; H01L 21/6715; H01L 21/02282; H01L 21/0273; H01L 21/31058; H01L 21/31051; G03F 7/162
USPC ........................... 427/240, 425; 438/780, 782
See application file for complete search history.

(56) References Cited

U.S. PATENT DOCUMENTS

| | | | | |
|---|---|---|---|---|
| 4,515,828 | A * | 5/1985 | Economy | G11B 5/84 427/129 |
| 5,366,757 | A * | 11/1994 | Lin | 427/9 |
| 6,391,800 | B1 * | 5/2002 | Redd et al. | 438/782 |
| 6,530,340 | B2 * | 3/2003 | You | H01L 21/76801 118/320 |
| 8,282,999 | B2 * | 10/2012 | Sinha et al. | 427/560 |
| 2001/0033895 | A1 * | 10/2001 | Minami et al. | 427/240 |
| 2008/0057194 | A1 * | 3/2008 | Tanaka | 427/240 |
| 2012/0034792 | A1 * | 2/2012 | Yoshihara et al. | 438/778 |

* cited by examiner

*Primary Examiner* — Kirsten Jolley
(74) *Attorney, Agent, or Firm* — Slater Matsil, LLP

(57) ABSTRACT

A method of forming a coating, comprises applying a first coating to a substrate having a plurality of topographical features, planarizing a top surface of the first coating, and drying the first coating after planarizing the top surface. The first coating may be applied over the plurality of topographical features, and may be substantially liquid during application. The first coating may optionally be a conformal coating over topographical features of the substrate. The conformal coating may be dried prior to planarizing the top surface of the first coating. A solvent may be applied to the conformal coating, with the top surface of the conformal coating being substantially planar after application of the solvent. The first coating may have a planar surface prior to drying the first coating, and the first coating may be dried without substantial spin-drying by modifying an environment of the first coating.

20 Claims, 5 Drawing Sheets

METHOD AND APPARATUS FOR PLANARIZATION OF SUBSTRATE COATINGS

This application claims the benefit of U.S. Provisional Application No. 61/778,298, filed on Mar. 12, 2013, entitled "Method and Apparatus for Planarization of Substrate Coatings," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past.

Substrate coatings such as photoresists, polymer coatings and the like are used during the production and finishing processes for semiconductor dies. Those coatings are sometimes "spun on" to a substrate, with a liquid being applied to a substrate and then spun to distribute the coating on the substrate. Subsequent processing steps such as photoresist patterning, post-passivation layer interconnect layers or the like may be applied over the spun on coatings.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to illustrate the relevant aspects of the embodiments and are not necessarily drawn to scale.

DETAILED DESCRIPTION

Figure 1:
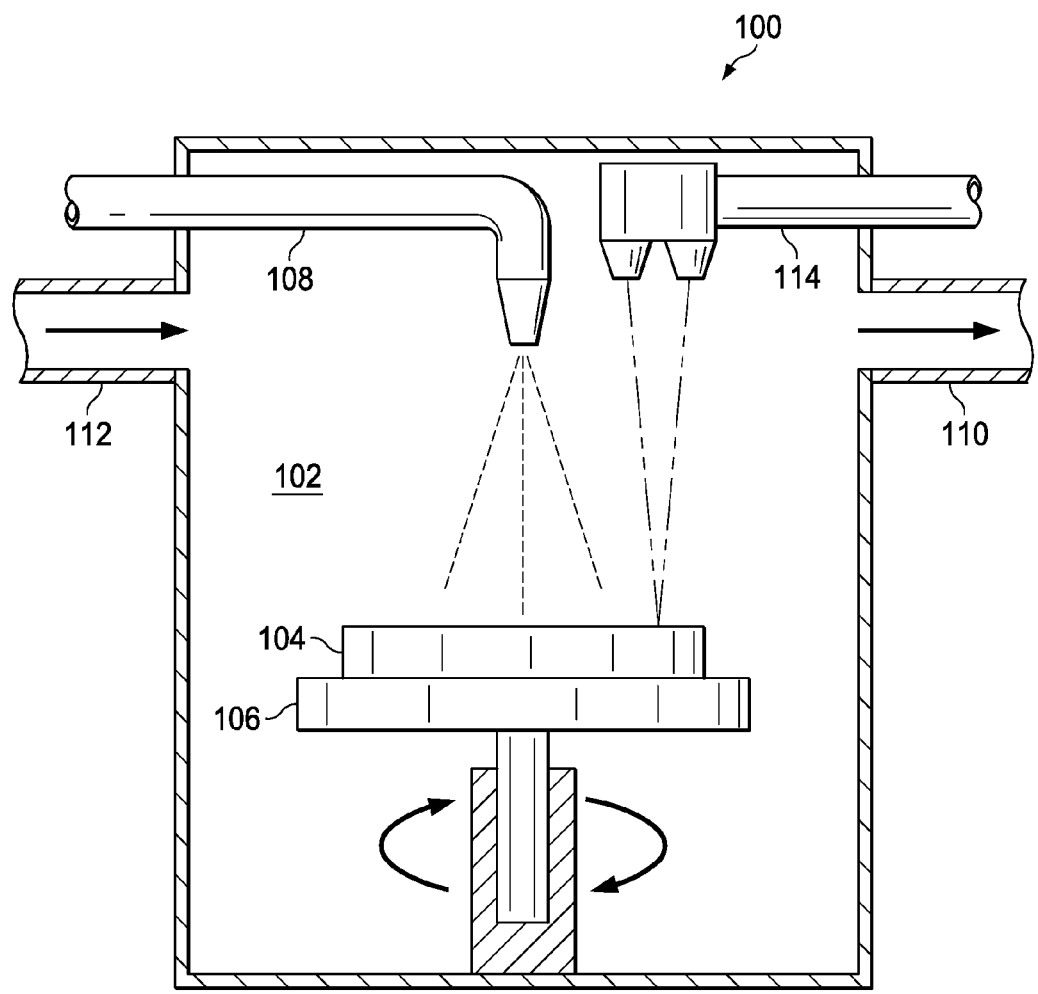
FIG. 1 illustrates an apparatus for applying a planar substrate coating according to an embodiment.

The making and using of the presented embodiments are discussed in detail below. It should be appreciated, however, that the present disclosure provides many applicable concepts that can be embodied in a wide variety of specific contexts. The specific embodiments discussed are merely illustrative of specific apparatuses and ways to make and use the planar substrate coating, and do not limit the scope of the disclosure.

Embodiments will be described with respect to a specific context, namely making and using planar coatings useful in, for example, semiconductor device manufacturing processes such as coatings for packaging, passivation layers, molding compounds, or the like, or another type of planar coating.

The embodiments of the present disclosure are described with reference to FIGS. 1 through 4, and variations of the embodiments are also discussed. Throughout the various views and illustrative embodiments of the present disclosure, like reference numbers are used to designate like elements. Additionally, the drawings are intended to be illustrative, are not to scale and not intended to be limiting. Note that, for simplification, not all element numbers are included in each subsequent drawing. Rather, the element numbers most pertinent to the description of each drawing are included in each of the drawings.

The application of a coating to a wafer is a technique sometimes used in, for example, semiconductor fabrication. Generally, a conformal coating attempts to form a layer of constant thickness over a surface. Often times, however, conformal coating results in thickness variances between topographically dense and isolated areas as well as a nonplanar top surface that may create inconsistencies or errors in subsequent processing steps. Non-uniformity of the coating may be particularly evident where a wafer has high aspect ratio topographic features. Usually coating at the topographically dense areas will be thicker than in isolated areas.

In an embodiment, a photoresist may be applied as a liquid and then cured and baked prior to patterning. Similarly, a coating, such as, for example, post-passivation layers such as polymers or protective layers may be applied over a passivation layer or redistribution layer. It has been discovered that a planar surface on an applied coating may result in superior performance of the coating.

The non-uniform top coating surface of a conformal coating may lead to poor focus leveling, upper-layer peeling, or non-uniform loading during planarization steps such a chemical-mechanical polishing (CMP). For example, where a photoresist is used, the varied topography of a conformal coating surface may result in a less accurate photolithographic masking of the photoresist due to inconsistent focus leveling. In another example, where a polymer or protective layer is coated on a non-planar surface, a conformal coating may result in poor performance or inaccurate formation of post-passivation interconnects or other subsequent features. In contrast, a coating with a relatively flat top surface or a surface free of substantial topological variation permits more accurate post-coating processing.

FIG. 1 illustrates a coating apparatus 100 for applying a planar substrate coating according to an embodiment. A coating apparatus 100 may comprises a coating chamber 102 with a platen 106 configured to retain a wafer 104. A coating nozzle 108 may be disposed in the coating chamber 102 and may be configured to apply a coating to a surface of the wafer 104 when the wafer 104 is disposed on the platen 106. A thickness monitor 114 may also be disposed in the coating chamber 102 and may be configured to take measurements of coating thickness on the wafer 104. The coating chamber 102 may further have an inflow opening 112 and an outflow opening 110 permitting gas exchange in the coating chamber 102.

In an embodiment, the coating chamber 102 may be a sealed, or clean, environment in which a wafer 104 is processed. The coating chamber 102 may also have one or more heating elements (not shown) or otherwise be configured to control the temperature of the environment contained in the coating chamber 102. The coating chamber 102 may also be configured to control other factors related to the environment of the coating chamber, including, but not limited to, the pressure or partial pressure of one or more gases, the humidity, the flow rate of gases in and/or out of the coating chamber 102, or any other number of factors. The inflow opening 112 and outflow opening 110 may be manipulated to control the environment by, for example, controlling the flow rate of gas through the coating chamber 102.

A wafer 104 may be loaded onto the platen 106, which may retain the wafer 104, through, for example, a vacuum chuck, an adhesive, a physical retainer such as a clip, or another suitable retaining method. The platen 106 may be configured to rotate at one or more preselected speeds, with the platen 106 able to stop or rotate during coating application and after the coating application. In an embodiment, the platen 106 may rotate at a first speed during the coating application, and after coating application, or after a predetermined time after the coating application, may rotate at a second lower speed. For example, the platen 106 may rotate at 100 RPM during application of the coating in order to ensure even distribution of the coating on the wafer 104 surface. After the coating is applied, the platen 106 may slow rotation to, for example, 20 RPM, or may stop completely for subsequent processing steps.

The platen 106 may be further configured to vibrate or shake the attached wafer 104. In an embodiment, the platen 106 may vibrate at a frequency between about 10 Hz and 10 MHz. The platen 106 may vibrate the wafer 104 during application of the coating, or any time after application of the coating. Vibrating the wafer 104 during the coating application may cause the coating to settle more evenly over the surface of the wafer 104, causing the coating to settle into voids, valleys or the like between topography features on the wafer 104. Furthermore, any bubbles or other imperfections in the coating may be released from under the surface of the coating prior to the coating drying. Removing bubbles and ensuring a consistent application of the coating reduces errors in later processing. For example, a photoresist coating may develop bubbles in the coating when applied. Releasing the bubbles in the photoresist permits the bubbles to come to the surface and pop so that the bubbles will not interfere with the photoresist patterning. When the photoresist is patterned via photolithography, the resulting photoresist mask is more consistent with the intended pattern since bubbles that may have distorted the photo patterning have been reduced or removed.

In an embodiment, the coating nozzle 108 may be arranged facing the wafer 104 and may be configured to deliver one or more materials to the surface of the wafer 104. The coating nozzle 108 may be configured to spray a coating in liquid or aerosolized form onto the wafer 104, but may also be configured to separately deliver additional materials such as a buffer solvent, a coating reflow solvent, a rinse material, or the like.

The thickness monitor 114 may be a measurement device used to measure the thickness of a coating as applied, or during or after coating processing. In an embodiment, the thickness monitor 114 may be an inline ellipsometer, reflective thickness monitor, or a non-contact thickness measurement device.

Figure 2A:
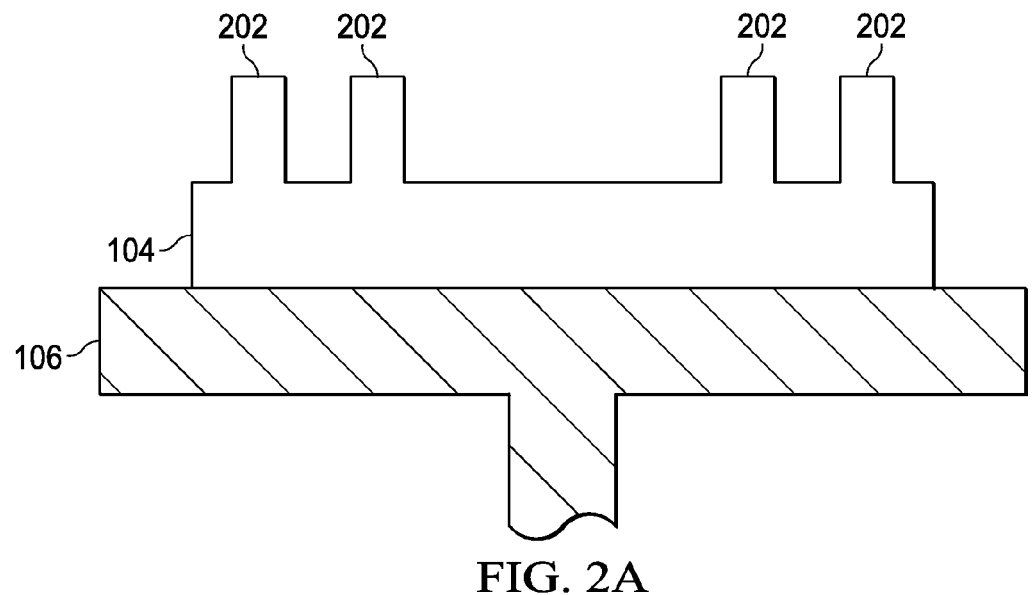
FIGS. 2A-2D and 3A-3C are cross-sectional views of intermediate process steps in forming a planar substrate coating according to various embodiments.

FIG. 2A is a cross-sectional view illustrating an initial wafer 104 with topographical features 202 according to an embodiment. In an embodiment, a coating may be applied to the wafer 104 and planarized prior to drying. The wafer 104 may be a semiconductor wafer, a die wafer, a workpiece, or any other structure that will have a coating applied. The wafer 104 may be attached to the platen 106 for coating as described above. In an embodiment, the wafer 104 may comprise one or more topographical features 202. For example, the wafer 104 may have one or more finFET devices being formed thereon, where the topographical features 202 are fins, gates, or the like, and the coating may be a photoresist to be patterned for etching or metal layer deposition. In another example, the topographical features 202 may be planar transistors gate structures, RDL layers, metal layers, or the like. In an embodiment, the topographical features 202 may be greater than about 50 nm high.

Figure 2B:
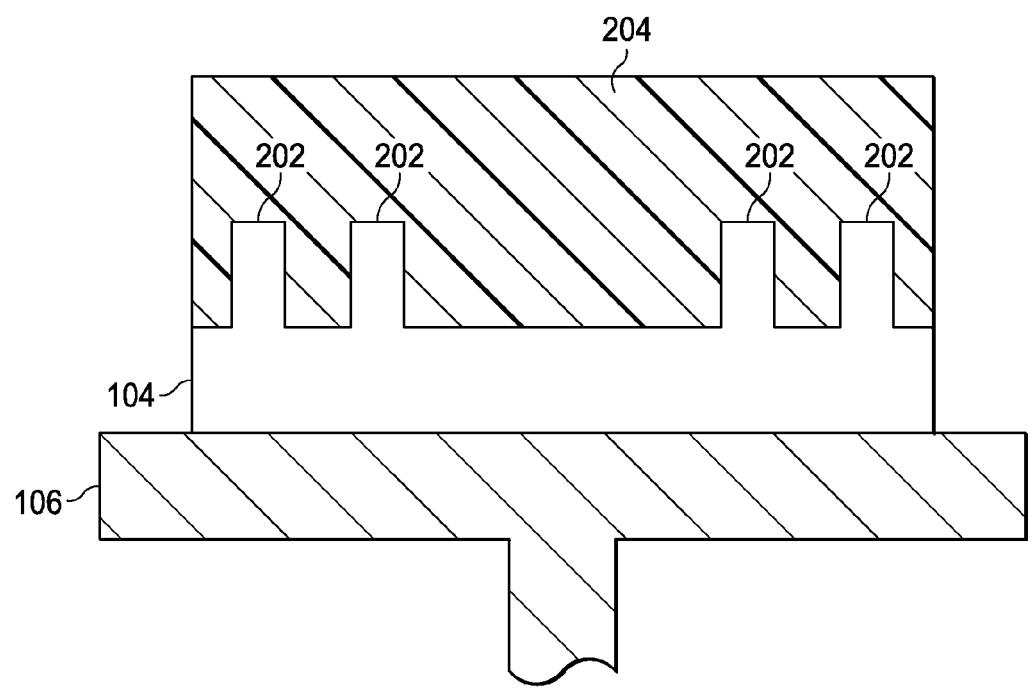

FIG. 2B is a cross-sectional view illustrating application of a coating 204 to a wafer 104 according to an embodiment. The coating 204 may be a polymer or other material carried in water, a solvent such as an alcohol, an organic material, or the like. In an embodiment, the coating may be applied as a liquid, or as an aerosol building a film on the surface of the wafer 104. The coating 204 may be applied thicker than the target thickness to account for shrinkage of the coating 204 as it dries. The coating 204 may be applied to a thickness between about 5 times and about 10,000 times as thick as the target thickness of the coating 204. The target thickness of the coating 204 will, in an embodiment, be a predetermined thickness, and may be greater than the greatest height of the topographical features 202. Thus, the final coating will be at a height that rises higher than, and covers, the topographical features 202. In an embodiment, the coating 204 will have a planar top surface 204a while still substantially liquid, and will retain the planar top surface 204a during subsequent drying.

The platen 106 may spin the wafer 104 during application of the coating 204 to ensure that the coating 204 flows into recesses between the topographical features 202. In an embodiment, the platen 106 may also vibrate the wafer 104 as the coating 204 is applied to aid in the coating 204 flowing into the recesses between the topographical features 202 as well as releasing any air pockets or bubbles that may form during application of the coating 204. In an embodiment, the coating 204 may have a surface tension of less than about 50 dyne/cm after application.

Application of the coating 204 may comprise applying a buffer solvent to the wafer 104 prior to applying the coating 204. The buffer solvent may be applied to maintain the liquidity or viscosity of the coating 204 during application, or to ensure that the coating 204 does not dry prematurely.

Figure 2C:
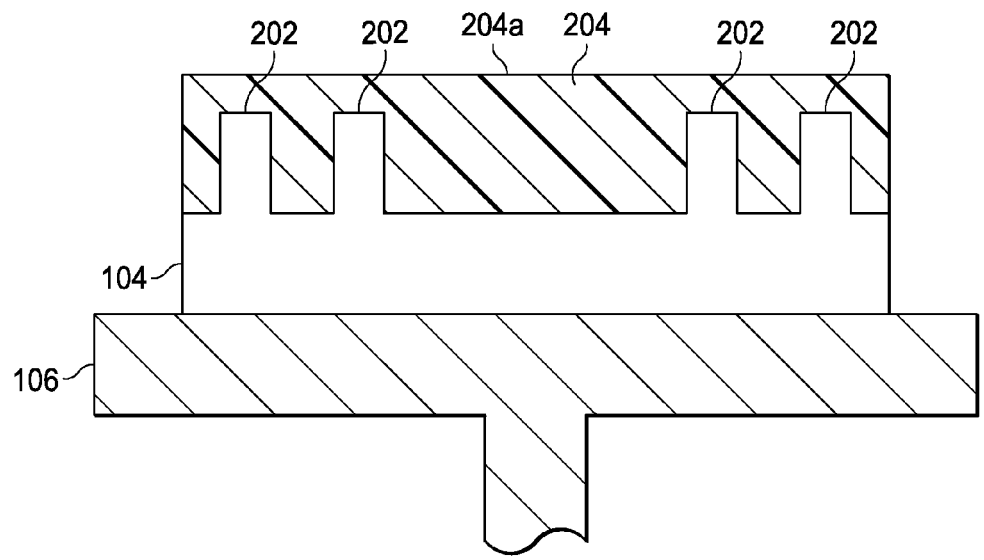

FIG. 2C is a cross-sectional view illustrating drying of the coating 204 according to an embodiment. The coating 204 may be dried by evaporating the solvent in the coating 204, with the evaporation of the solvent being primarily performed by controlling the environment of the coating chamber. In such an embodiment, the coating may be dried without spin-drying. The coating 204 may be dried to have a top surface 204a with a surface topography having features varying less than about 10 nm.

In an embodiment, the temperature and environmental conditions of the coating chamber 102 may be controlled to cause drying of the coating 204. The coating 204 may be dried while the platen 106 is at a reduced spin speed, or while the platen 106 is stopped. The platen 106 may have its spin stopped or slowed before the applied coating 204 sets, cures, or dries, permitting the coating 204 to settle and then dry with a substantially planar top surface 204a. For example, the coating 204 may be applied while the platen 106 spins at about 100 RPM, and the platen 106 speed may be reduced to, for example, 20 RPM for a period to permit the coating 204 to settle or slump and form a planarized top surface 204a. The platen 106 may also be vibrated at a first speed, for example, 100 Hz, during application of the coating 204 to settle the coating 204, and may be vibrated at 10 KHz during after application of the coating 204 and prior to drying to release any bubbles in the coating 204. The reduced spin speed during drying may permit the coating 204 to retain a substantially planar top surface 204a during drying.

In an embodiment, the conditions in the coating chamber 102 such as temperature or platen 106 spin speed may be monitored and controlled by a controller such as a production management system, by an integrated controller, by a general purpose computer in signal communication with the coating chamber, by manual adjustment, or another suitable system.

In an embodiment, the coating chamber 102 may bring the environment temperature up to between about 30° C. and about 250° C. and the wafer 104 with coating 204 may then be held in the coating chamber 102 at the elevated temperature until the coating 204 dries. The coating chamber 102 may also manage or control the pressure and gas flow to the coating chamber 102 separately from, or in combination with, the temperature, to ensure sufficiently controlled drying of the coating 204. For example, the coating chamber 102 may flow air through the coating chamber 102 at a rate between about 50 ml/min and about 50 l/min, and the pressure in the coating chamber 102 may be maintained at a pressure between about 300 Pa and 1 MPa. The inflow opening 112 and outflow opening 110 may be controlled to maintain a predetermined pressure and gas flow rate through the coating chamber 102. It will be recognized that the rate of drying for the coating 204, or the rate of solvent evaporation, may be controlled through control of the temperature, gas flow, gas pressure, or the like.

Skilled practitioners will recognize that the platen 106 spin speed and vibration frequency and coating chamber 102 temperatures, pressures and gas flow rates may depend on the desired coating 204 thickness, the viscosity of the coating 204 when applied, the speed with which the coating 204 dries, the size of the wafer, or one or more other factors, and that the exemplary conditions may be adjusted to provide efficient processing of various coatings and wafers.

Drying the coating 204 may result in the coating having a height about equal to the predetermined final coating height. In an embodiment, the coating 204 may have a solvent or carrier when applied, and the drying may force the solvent from the coating 204, resulting in a coating thickness that is lower than the thickness of the coating 204 when applied.

Figure 2D:
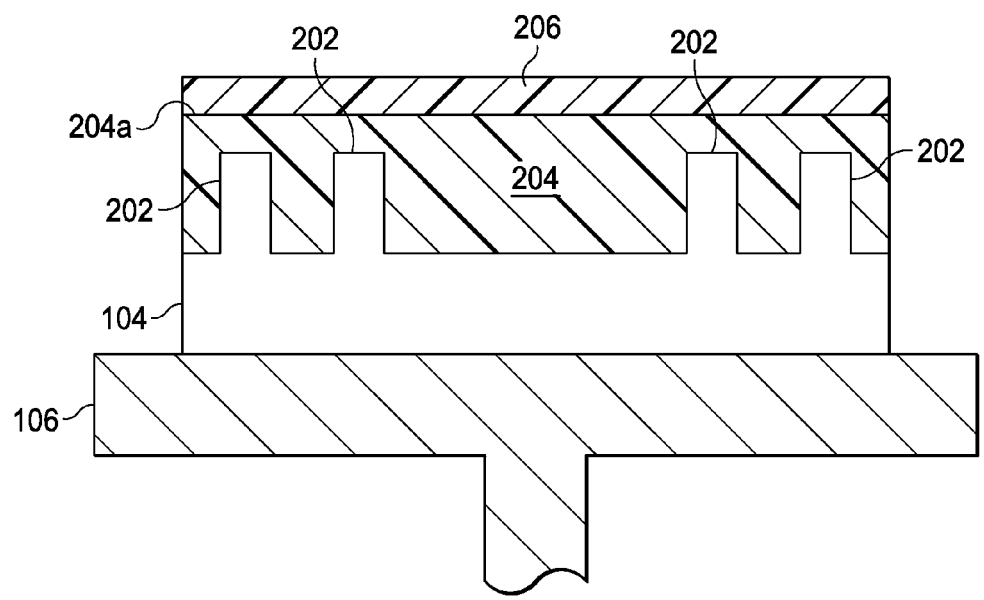

FIG. 2D is a cross-sectional view illustrating application of a second coating 206 according to an embodiment. The second coating 206 may be applied to the top surface 204a of the coating 204 to bring the overall coating height to a predetermined depth. The thickness monitor 114 may determine the depth of the coating 204 and the second coating 206 may be applied to compensate for any variance from a desired thickness. In an embodiment, the coating top surface 204a may be substantially planar, and so application of the second coating 206 may be performed by a spin-on and spin-dry process since most topographical variations will have been compensated for by the coating 204.

Figure 3A:
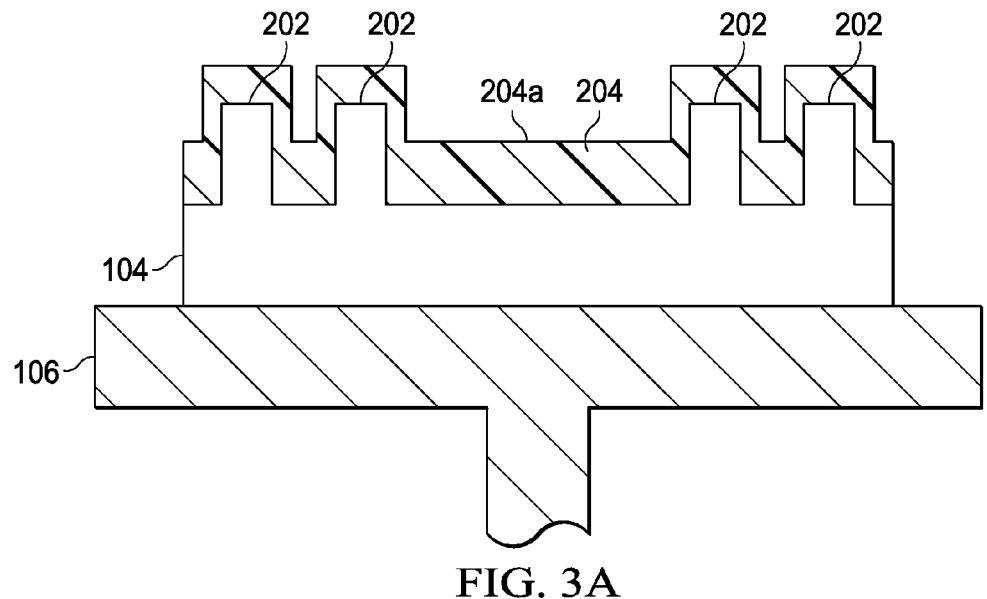

FIG. 3A is a cross-sectional view illustrating application and drying of a coating 204 to a wafer 104 according to an embodiment. In an embodiment, the coating 204 may be applied to the wafer 104 and dried prior to planarization. In such an embodiment, the coating 204 may be applied conformally, with the coating top surface 204a having variations in topography. The wafer 104 may be intentionally coated with a conformal coating 204 by spin drying the coating 204. The conformal coating 204 may also be a result of insufficient planarization under a coating method, for example, such as in the embodiment described with respect to FIGS. 2A-2D.

Figure 3B:
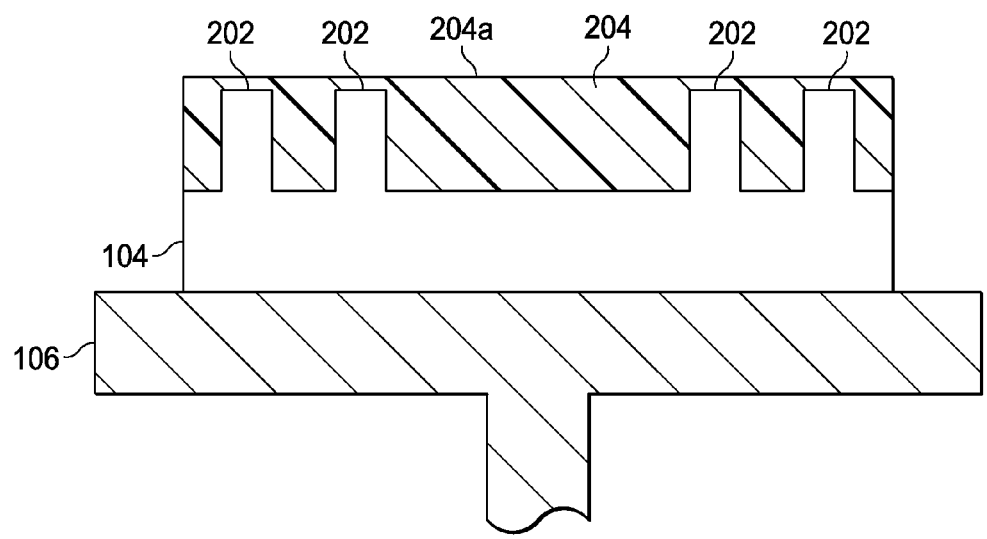

FIG. 3B is a cross-sectional view illustrating planarization of a conformal coating 204 according to an embodiment. A solvent may be applied to the dried, conformal coating 204 to dissolve or reflow a portion of the coating 204. In such an embodiment, the coating 204 will achieve a substantially planar top surface 204a during reflow, or while liquid, and retain that planar top surface 204a during and after drying.

In an embodiment, the solvent may be, for example, an organic solvent or water, or a hybrid with a surfactant to reduce the reflowed coating surface tension. The surfactant structure may be a hydrocarbon with, for example, 1 to about 25 carbon atoms arranged in a straight, branched or cyclic structure. In an embodiment, the surfactant may have a $R_1$—$(—O)_n$—$R_2$ structure where n is 1 to about 15. $R_1$ and $R_2$ may be alkyl groups that may comprise heterostructures such as nitrogen, oxygen, or fluorine. $R_1$ and $R_2$ may also comprise nitro- or sulfonic-groups or double or triple bond alkyl structures.

The coating 204 may be vibrated or spun, or a combination of the foregoing, during coating reflow to cause the reflowed coating 204 to settle or planarize. After the reflowed coating 204 achieves a substantially planar top surface 204a, the coating 204 may be dried again to drive off any solvent and surfactant, solidifying the planar coating 204.

Figure 3C:
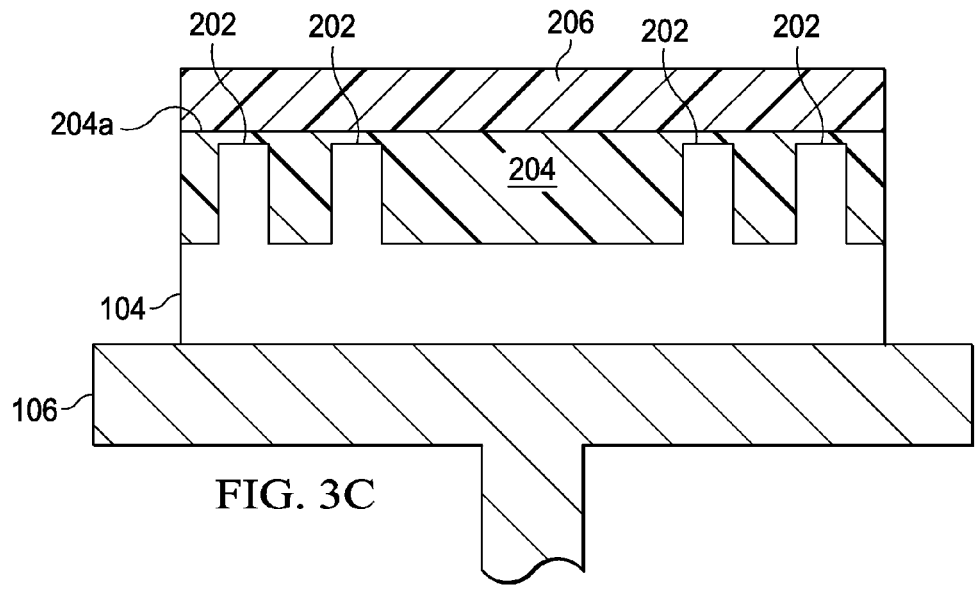

FIG. 3C is a cross sectional view illustrating application of a second coating according to an embodiment. The thickness of the coating 204 after reflow may be measured, for example, by the thickness monitor 114, and the second coating 206 applied to compensate for deviation form a desired thickness in the coating 204. In an embodiment, the coating may be applied to have a thickness sufficient to cover the topographic features 202 on the wafer 104, and reflowed to fill any recesses between the topographic features 202. The second coating 206 may be subsequently applied to bring the overall coating height to a desired or predetermined thickness.

Figure 4:
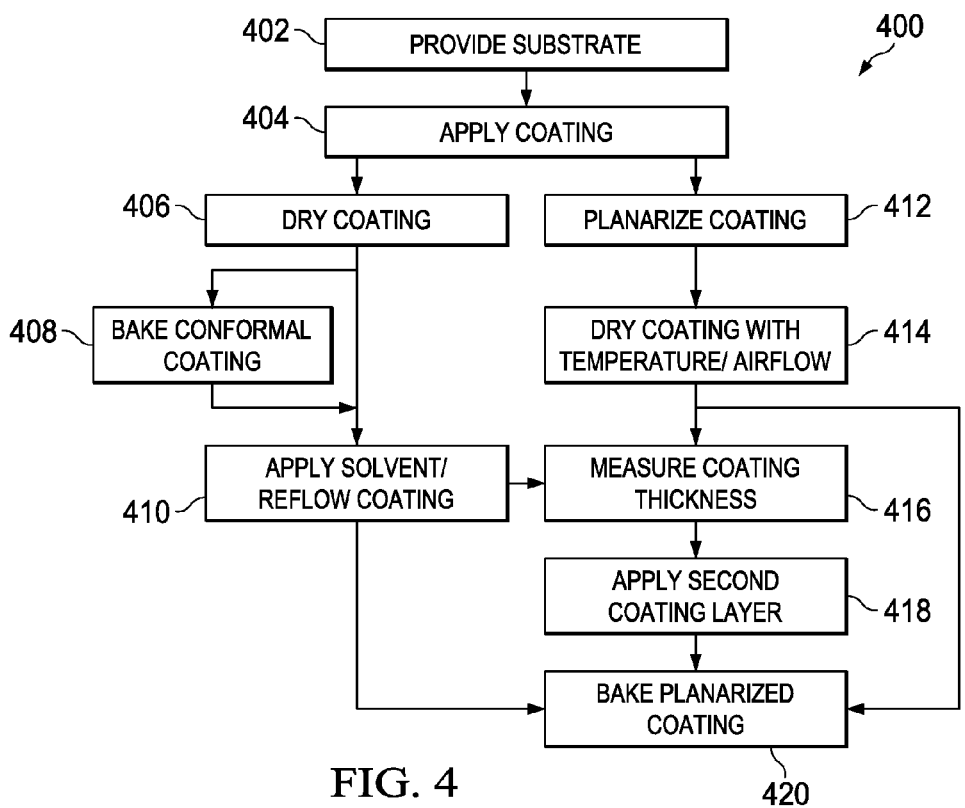
FIG. 4 is a flow diagram illustrating a method for forming a planar substrate coating according to an embodiment.

FIG. 4 is a flow diagram illustrating a method 400 for forming a planar coating according to an embodiment. A substrate or wafer may be provided in block 402. The wafer may have one or more topographic features disposed on a first side. A coating may be applied to the first side of the wafer in block 404. In an embodiment, the wafer may be spun, vibrated, or otherwise manipulated during coating application to distribute the coating over the surface of the first side of the wafer. In an embodiment, the coating may be planarized or leveled in block 412. Planarizing the coating may comprise spinning, vibrating or otherwise manipulating the coating to cause conformation portions of the coating to settle and to cause the top surface of the coating to achieve a substantially planar state. The coating may be dried by way of temperature and air flow in block 414. In such an embodiment, the coating may be dried without substantial drying from spin-dry.

In another embodiment, the coating may be dried in block 406 after application of the coating in block 404. In such an embodiment, the coating may be spun to achieve at least a partially conformal coating distribution. In an embodiment, the coating may optionally be spin dried. In block 408, the coating may be optionally baked to further drive out any solvents, to cure the coating, or to finalize or complete any reactions in the coating. A solvent may be applied and the coating reflowed in block 410. The coating may be dried after the reflow. The thickness of the coating may optionally be measured in block 416 and a second coating optionally applied in block 418.

The planarized coating may be baked in block 420. In an embodiment, the coating may be processed further, for example, by patterning and developing a photoresist coating, by forming a post-passivation interconnect layer over a protective coating, or the like.

Thus, in an embodiment, a method of forming a coating may comprise applying a first coating to a substrate having a plurality of topographical features, planarizing a top surface of the first coating, and drying the coating after planarizing the top surface of the first coating. The first coating may be applied over the plurality of topographical features, and substantially liquid during application. The first coating may optionally be a conformal coating over topographical features of the substrate. The conformal coating may be dried prior to planarizing the top surface of the first coating and a solvent applied to the conformal coating, with the top surface of the conformal coating being substantially planar after application of the solvent. The coating may have a planar surface prior to the drying the first coating, and the first coating may be dried without substantial spin-drying by modifying an environment of the first coating.

According to an embodiment, a system for applying a coating may comprise a coating chamber with a platen configured to hold a wafer and a coating nozzle configured to deliver a first coating to the wafer. The coating chamber may be configured to dry the first coating on the wafer with a substantially planar top surface and without substantial spin drying. The platen may be configured to spin the wafer at a first speed during delivery of the first coating to the wafer and configured to spin the wafer at a second speed during drying of the first coating. The platen may be further configured to vibrate the wafer during application of the first coating and during drying of the first coating. The coating chamber may dry the first coating by controlling an environment contained in the coating chamber by modifying at least one of a gas pressure, a gas flow rate and a temperature. The first coating may be a conformal coating conforming to topographical features on the wafer. The coating chamber may be configured to dry the conformal coating prior to, and to planarize the top surface of the conformal coating after, drying the conformal coating by applying a solvent to the conformal coating. A thickness monitor may be configured to measure a thickness of the first coating, and the coating chamber may apply a second coating on the planar top surface of the first coating, with the second coating having a thickness depending on at least the thickness of the first coating measured by the thickness monitor.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, and composition of matter, means, methods or steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a coating, the method comprising:
   applying a first coating in a liquid state to a substrate having a non-planar top surface, the first coating being applied conformally to have a non-planar top surface;
   first drying the first coating to a solid state with a non-planar top surface after the applying the first coating;
   applying a solvent to the first coating after the first drying to re-liquefy the first coating, a top surface of the first coating achieving a substantially planar state after application of the solvent; and
   second drying the first coating after application of the solvent, the first coating having a substantially planar top surface after drying, wherein the top surface of the first coating is planarized before second drying the first coating.

2. The method of claim 1, wherein applying the solvent comprises reflowing at least a top portion of the first coating.

3. The method of claim 2, further comprising spinning the substrate at a first speed during application of the first coating and spinning the substrate at a second speed lower than the first speed during the first drying.

4. The method of claim 2, wherein the drying the coating after application of the solvent comprises drying the first coating through modifying an environment of the first coating.

5. The method of claim 4, wherein modifying the environment comprises modifying at least one of a gas pressure, a gas flow rate and a temperature.

6. The method of claim 1, further comprising applying a second coating over the top surface of the first coating.

7. The method of claim 6, wherein the second coating is spin coated and spin dried on the top surface of the first coating.

8. A method of forming a coating, the method comprising:
   applying a first coating to a substrate having a plurality of topographical features, the first coating applied over the plurality of topographical features, the first coating substantially liquid during application and applied at a first rotational speed;
   planarizing a top surface of the first coating by engaging a second rotational speed prior to drying the first coating to a solid state;
   after planarizing, first drying the first coating to a solid state;
   after first drying, applying a solvent to re-liquefy the first coating; and
   second drying the coating without spin-drying after re-liquefying the first coating.

9. The method of claim 8, wherein the first drying or the second drying comprises modifying an environment of the first coating.

10. The method of claim 8, wherein the second rotational speed is lower than the first rotational speed.

11. The method of claim 8, further comprising applying a second coating over the top surface of the first coating.

12. The method of claim 11, wherein the second coating is spin coated and spin dried on the top surface of the first coating.

13. The method of claim 9, wherein modifying the environment comprises modifying at least one of a gas pressure, a gas flow rate and a temperature.

14. A method of forming a coating to a substrate, the method comprising:
   conformally applying a first coating in a liquid state to an underlying layer and spinning the substrate at a first speed during application of the first coating;
   first drying the first coating to a solid state after applying the first coating;

introducing a solvent to dissolve at least a top portion of the first coating after the first drying, a top surface of the first coating achieving a substantially planar state after the dissolving; and second drying the first coating after the dissolving, the first coating having a substantially planar top surface after the second drying.

15. The method of claim 14, wherein the top surface of the first coating is planarized before the second drying.

16. The method of claim 14, further comprising spinning the substrate at a second speed lower than the first speed during the first drying.

17. The method of claim 14, wherein second drying the first coating after the dissolving comprises drying the first coating through modifying an environment of the first coating.

18. The method of claim 17, wherein modifying the environment comprises modifying at least one of a gas pressure, a gas flow rate and a temperature.

19. The method of claim 14, further comprising applying a second coating over the top surface of the first coating.

20. The method of claim 19, wherein the second coating is spin coated and spin dried on the top surface of the first coating.

* * * * *